(12) United States Patent
Ma et al.

(10) Patent No.: US 11,307,442 B2
(45) Date of Patent: Apr. 19, 2022

(54) DISPLAY MODULE AND DISPLAY DEVICE

(71) Applicant: BOE TECHNOLOGY GROUP CO., LTD., Beijing (CN)

(72) Inventors: Yongda Ma, Beijing (CN); Jianbo Xian, Beijing (CN); Yong Qiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 363 days.

(21) Appl. No.: 16/474,191

(22) PCT Filed: Jan. 22, 2019

(86) PCT No.: PCT/CN2019/072709
§ 371 (c)(1),
(2) Date: Jun. 27, 2019

(87) PCT Pub. No.: WO2019/205755
PCT Pub. Date: Oct. 31, 2019

(65) Prior Publication Data
US 2021/0333610 A1 Oct. 28, 2021

(30) Foreign Application Priority Data
Apr. 25, 2018 (CN) .......................... 201820596506.7

(51) Int. Cl.
*G02F 1/1333* (2006.01)
*G02F 1/1337* (2006.01)
(Continued)

(52) U.S. Cl.
CPC .. *G02F 1/133308* (2013.01); *G02F 1/133608* (2013.01); *G02F 1/133796* (2021.01);
(Continued)

(58) Field of Classification Search
None
See application file for complete search history.

(56) References Cited

U.S. PATENT DOCUMENTS

2006/0098134 A1 5/2006 Park et al.
2013/0242227 A1 9/2013 Zhang
(Continued)

FOREIGN PATENT DOCUMENTS

CN 1619366 A 5/2005
CN 102566106 A 7/2012
(Continued)

OTHER PUBLICATIONS

Translation of KR20060132371A (Year: 2005).*
International Search Report and Written Opinion dated Apr. 10, 2019; PCT/CN2019/072709.

*Primary Examiner* — Phu Vu

(57) ABSTRACT

A display module includes: a backplate; a backlight module disposed on the backplate; a liquid crystal panel disposed on the backlight module; a frame configured to fix the liquid crystal panel; a circuit board disposed on the backplate; and a conductive part. The conductive part is connected with the backplate or the circuit board, the conductive part includes an elastic portion connected with the liquid crystal panel, and at least part of the elastic portion is located between the liquid crystal panel and the frame and is in a compression state. A display device is further disclosed.

20 Claims, 2 Drawing Sheets

(51) Int. Cl.
*G02F 1/13357* (2006.01)
*H05K 1/18* (2006.01)

(52) U.S. Cl.
CPC ....... *H05K 1/18* (2013.01); *H05K 2201/0311* (2013.01); *H05K 2201/10136* (2013.01)

(56) References Cited

U.S. PATENT DOCUMENTS

2015/0245506 A1* 8/2015 Im .................... G02F 1/133512
362/612
2018/0314349 A1* 11/2018 Jiang .................... H02J 50/005

FOREIGN PATENT DOCUMENTS

CN 208399850 U 1/2019
KR 1020080132371 A 12/2006

* cited by examiner

DISPLAY MODULE AND DISPLAY DEVICE

TECHNICAL FIELD

Embodiments of the present disclosure relate to a display module and a display device.

BACKGROUND

In a liquid crystal display device, light emitted from a backlight module is supplied to a liquid crystal panel so that the liquid crystal panel displays an image. With the development of the display technology, the demand for touch operation during the use of liquid crystal display devices is becoming more and more intense.

SUMMARY

At least an embodiment of the present disclosure provides a display module, including: a backplate; a backlight module disposed on the backplate; a liquid crystal panel disposed on the backlight module; a frame configured to fix the liquid crystal panel; a circuit board disposed on the backplate; and a conductive part, wherein the conductive part is connected with the backplate or the circuit board, the conductive part includes an elastic portion connected with the liquid crystal panel, and at least part of the elastic portion is located between the liquid crystal panel and the frame and is in a compression state.

In an embodiment of the present disclosure, the elastic portion includes a foam and a conductive layer covering the foam.

In an embodiment of the present disclosure, the foam includes a conductive foam.

In an embodiment of the present disclosure, the conductive layer includes a metal sheet or a metal wire braid layer.

In an embodiment of the present disclosure, the conductive layer is in non-adhesive contact with the liquid crystal panel.

In an embodiment of the present disclosure, the display module further includes a plastic frame; the backplate includes a bottom plate and a side plate connected with the bottom plate; the plastic frame includes a first plastic frame portion and a second plastic frame portion, wherein the first plastic frame portion is configured to support the display panel, and the second plastic frame portion is disposed between the frame and the side plate; the conductive part includes a first conductive section and a second conductive section, wherein the first conductive section is located between the frame and the first plastic frame portion, the elastic portion is disposed on the first conductive section, and the second conductive section is connected with the first conductive section, the second conductive section is connected with at least one of the side plate and the circuit board, and the second conductive section is located at least partially between the frame and the second plastic frame portion.

In an embodiment of the present disclosure, the second conductive section is connected with at least one of the side plate and the circuit board across a lower edge of the second plastic frame portion.

In an embodiment of the present disclosure, the second conductive section is connected with the side plate through a connector, and the connector passes through the second conductive section and the second plastic frame to be connected with the side plate.

In an embodiment of the present disclosure, the second plastic frame portion has a through hole, and the second conductive section passes through the through hole to be connected with at least one of the side plate and the circuit board.

In an embodiment of the present disclosure, the first conductive section is disposed on a surface of the frame facing the bottom plate, and the second conductive section is disposed on a surface of the frame facing the second plastic frame portion.

In an embodiment of the present disclosure, the display module further includes a conductive buffer part, and the conductive buffer part is located between the display panel and the elastic portion.

In an embodiment of the present disclosure, the conductive buffer part includes a conductive foam tape.

At least an embodiment of the present disclosure further discloses a display device, including any one of the display modules described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art may obtain other embodiment(s), without any inventive work, which should be within the scope of the invention.

The terms "first", "second", and the like, which are used in the present disclosure, are not intended to indicate any sequence, amount or importance, but distinguish various components. The terms "comprise", "comprising", "include", "including", and the like, are intended to specify that the elements stated before these terms encompass the elements listed after these terms, but do not preclude the other elements. "On", "under", etc., are only used to indicate relative position relationship, and when the absolute position of the object which is described is changed, the relative position relationship may be changed accordingly.

In the present disclosure, when it is described that a particular component is located between a first component and a second component, there may be an intervening component between the particular component and the first component or the second component, or there may be no intervening component. When it is described that a particular component is connected with other components, the particular component may be directly connected with the other components without the intervening component, or may be indirectly connected to the other components with the intervening component.

Unless otherwise defined, all terms (including technical or scientific terms) used in the present disclosure have the same meaning as understood by one of ordinary skill in the art to which the disclosure belongs. It should also be understood that terms defined in, such as, a general dictionary should be interpreted as having a meaning consistent with their meaning in the context of the related art, without the application of idealized or extremely formal meanings, unless explicitly defined herein.

Techniques, methods and apparatus known to one of ordinary skill in the relevant art may not be discussed in detail, but the techniques, methods and apparatus should be considered as part of the specification, where appropriate.

Figure 1:
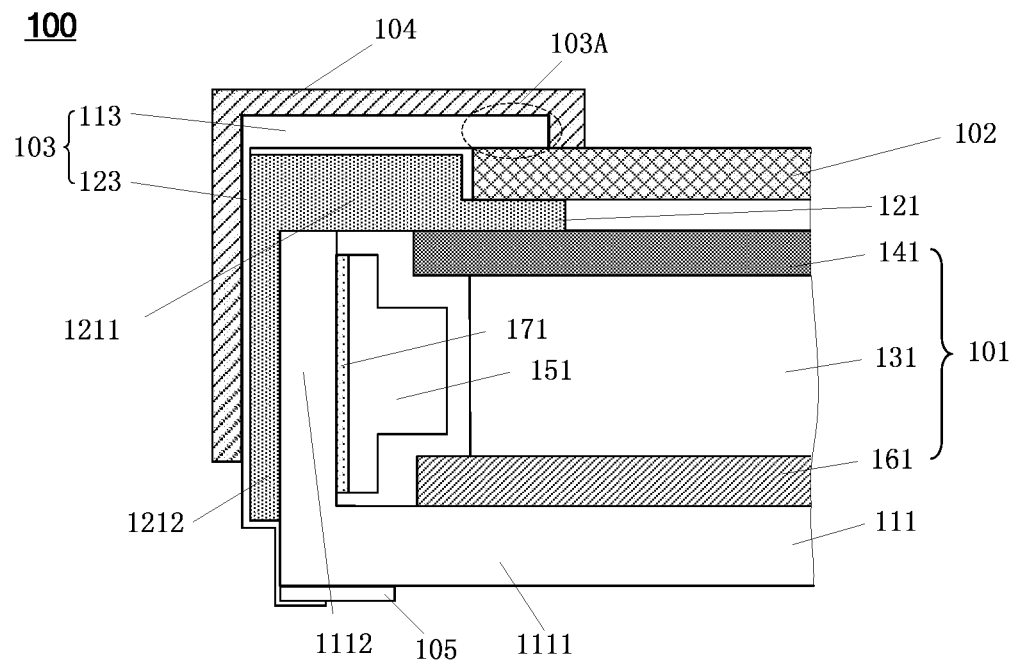
FIG. 1 is a schematic diagram of a display module according to an embodiment of the present disclosure.

FIG. 1 is a schematic diagram of a display module according to an embodiment of the present disclosure.

As shown in FIG. 1, a display module 100 includes a backplate 111, a backlight module 101 disposed on the backplate 111, and a liquid crystal panel 102 disposed on the backlight module. The display module 100 further includes a frame 104 configured to fix the liquid crystal panel 102.

The backlight module 101 includes a light guide plate 131, an optical film 141, a light source 151, and the like components. Referring to FIG. 1, the light guide plate 131 may be located on the backplate 111, the optical film 141 may be located on the light guide plate 131, and the light source 151 may be disposed on a lateral side of the light guide plate 131. Alternatively, the backlight module 101 may further include a bottom reflective sheet 161 disposed between the light guide plate 131 and the backplate 111.

The display module further includes a plastic frame 121 configured to press the optical film 141 and the light guide plate 131 below the optical film 141. The liquid crystal panel 102 may be configured to be supported by the plastic frame 121.

The display module further includes a circuit board 105 disposed on the backplate 111. For example, the circuit board 105 may be disposed on a side of the backplate away from the light guide board. Of course, the circuit board 105 may also be disposed on a side of the backplate provided with the light guide plate. Here, the circuit board 105 may include, for example, a gate drive circuit board or a source drive circuit board. For example, the circuit board 105 may be connected with the backplate 111 through a connecting layer. For example, both of the circuit board 105 and the backplate 111 may be bonded together by a glue layer.

The display module further includes a conductive part 103 configured to be connected with the liquid crystal panel 102 and be connected with at least one of the backplate 111 and the circuit board 105. FIG. 1 schematically illustrates the situation that the conductive part 103 is connected with both of the backplate 111 and the circuit board 105. In an embodiment of the present disclosure, the backplate 111 is a conductive backplate (for example, a metal backplate), and in this case the conductive part 103 may be only connected with the backplate 111, or may be connected with both of the backplate 111 and the circuit board 105. In an embodiment of the present disclosure, the backplate 111 is a non-conductive backplate, and in this case the conductive part 103 may be only connected with the circuit board 105, or may be connected with both of the backplate 111 and the circuit board 105.

The conductive part 103 includes an elastic portion 103A, and at least part of the elastic portion 103A is located between the liquid crystal panel 102 and the frame 104, which is for fixing the liquid crystal panel 102, and is in a compression state, and the at least part of the elastic portion 103A is connected with the liquid crystal panel 102. In other words, at least part of the elastic portion 103A is pressed between the liquid crystal panel 102 and the frame 104. Because at least part of the elastic portion 103A is pressed between the liquid crystal panel 102 and the frame 104, the elastic portion 103A can still maintain a stable connection with the liquid crystal panel 102 when the liquid crystal panel 102 is deformed due to thermal expansion or cold contraction. In the above embodiments, the conductive part 103 is connected with the liquid crystal panel 102 and is connected with at least one of the backplate 111 and the circuit board 105. The static electricity on the liquid crystal panel 102 can be conducted to at least one of the backplate 111 and the circuit board 105 via the conductive part, thereby reducing the influence of static electricity on the liquid crystal panel 102, and improving the display effect. Further, the elastic portion 103A in the compression state can maintain a stable connection between the liquid crystal panel 102 and the elastic portion 103A, preventing the disconnection between the liquid crystal panel 102 and the elastic portion due to deformation of the liquid crystal panel 102.

In an embodiment of the present disclosure, the elastic portion 103A of the conductive part 103 includes a foam and a conductive layer covering the foam. Alternatively, other portions of the conductive part 103 may also include a foam and a conductive layer covering the foam. In an embodiment of the present disclosure, the foam may include a conductive foam to make the elastic portion more conductive. In an embodiment of the present disclosure, the conductive layer may include a metal sheet, a metal wire braid layer, or the like. In an embodiment of the present disclosure, the conductive layer is in non-adhesive contact with the liquid crystal panel 102. For example, an adhesive connection layer is disposed between the foam and a surface of the conductive layer facing away from the liquid crystal panel 102, and an adhesive connection layer is not disposed between the liquid crystal panel 102 and a surface of the conductive layer facing the liquid crystal panel 102. When the conductive layer is in non-adhesive contact with the liquid crystal panel 102 so that the liquid crystal panel 102 is deformed, the connection between the elastic portion and the liquid crystal panel 102 can be better ensured.

It should be understood that the elastic portion 103A is not limited to the above implementations. For example, in some embodiments of the present disclosure, the elastic portion 103A may comprise a conductive foam, and in this case the periphery of the conductive foam does not need to be covered by a conductive layer.

In an embodiment of the present disclosure, as shown in FIG. 1, the backplate 111 includes a bottom plate 1111 and a side plate 1112 connected with the bottom plate 1111. The plastic frame 121 includes a first plastic frame portion 1211 supporting the display panel 102 and a second plastic frame portion 1212 connected with the first plastic frame portion 1211. The first plastic frame portion 1211 is located above the side plate 1112, and the second plastic frame portion 1212 is disposed between the frame 104 and the side plate 1112. Here, the second frame portion 1212 may be in contact with the side plate 1112 or be connected with the side plate 1112 through a connection layer. In this case, the backlight module further includes a heat sink 171 located between the light source 151 and the backplate 111.

Accordingly, as shown in FIG. 1, the conductive part 103 may include a first conductive section 113 and a second conductive section 123. The first conductive section 113 includes the elastic portion 103A, and at least part of the elastic portion 103A is located between the frame 104 and the first plastic frame portion 1211 and is in a compression state. The second conductive section 123 is electrically connected with the first conductive section 113 and is connected to at least one of the side plate 1112 and the circuit board 105. The second conductive section 123 is at least partially located between the frame 104 and the second plastic frame portion 1212. FIG. 1 illustrates a configuration in which part of the second conductive section 123 is located between the frame 104 and the second plastic frame portion 1212.

In the above embodiment, the second conductive section 123 of the conductive part 103 is connected with at least one of the side plate 1112 and the circuit board 105 and is at least partially located between the frame 104 and the second frame portion 1212. The thickness of the display module can be reduced as compared to a configuration in which the conductive part 103 is connected though a horizontal plate that is provided to be connected with the side plate 1112.

The second conductive section 123 may be connected with at least one of the side plate 1112 and the circuit board 105 in different manners, and several exemplary implementations are described below.

In an embodiment of the present disclosure, as shown in FIG. 1, the second conductive section 123 may be connected with at least one of the side plate 1112 and the circuit board 105 across the lower edge of the second frame portion 1212. Such a manner can make the second conductive section 123 directly contact with at least one of the side plate 1112 and the circuit board 105, facilitating the conduction of the static electricity of the liquid crystal panel 102 to the side plate 1112.

In an embodiment of the present disclosure, the second conductive section 123 may be connected with only the side plate 1112 across the lower edge of the second frame portion 1212. In this case, the second conductive section 123 may extend, along a surface of the side plate 1112 across the lower edge of the second frame portion 1212, for example, extend downward. Such a manner can increase the contact area between the second conductive section 123 and the side plate 1112, thereby facilitating the conduction of the static electricity of the liquid crystal panel 102 to the side plate 1112.

Other ways of connecting the second conductive section 123 to the side plate 1112 will be described below with reference to FIGS. 2 and 3. It should be noted that, in the following description, only the differences between the embodiments illustrated in FIG. 2 and FIG. 3 and the embodiment illustrated in FIG. 1 will be described, and other identical or similar points may be referred to the above description.

Figure 2:
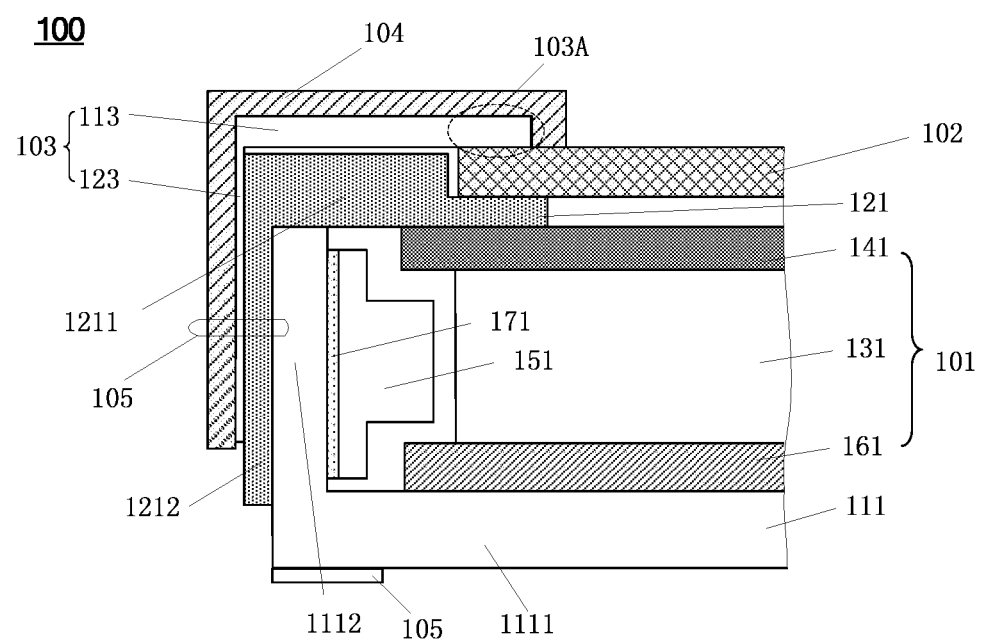
FIG. 2 is a schematic diagram of a display module according to another embodiment of the present disclosure.

FIG. 2 is a schematic diagram of a display module according to another embodiment of the present disclosure.

As shown in FIG. 2, the second conductive section 123 may be connected with the side plate 1112 through the connector 105. Here, the connector 105 may pass through the second conductive portion 123 and the second plastic frame portion 1212 and be connected with the side plate 1112. In this case, the entirety of the second conductive sections 123 may be located between the frame 104 and the second plastic frame portion 1212.

In an embodiment of the present disclosure, the connector 105 may pass through the frame 104, the second conductive section 123, and the second plastic frame portion 1212. For example, the connector 105 may be a screw or a bolt. For another example, the connector 105 may include a recess disposed on the frame 104, and a buckle disposed on the side plate 1112 corresponding to the recess. It should be understood that the implementations of the connector 105 listed above is merely exemplary implementations, and the disclosure is not limited thereto.

In an embodiment of the present disclosure, referring to FIG. 2, the first conductive section 113 may be disposed on a surface of the frame 104 adjacent to the first plastic frame portion 1211, and the second conductive section 123 may be disposed on a surface of the frame 104 adjacent to the second plastic frame portion 1212. This arrangement facilitates the assembly between the conductive part 103 and the frame 104.

In the configuration in which the second conductive section 123 is connected with the side plate 1112 through the connector 105, the connection between the second conductive section 123 and the side plate 1112 is tighter, facilitating the conduction of the static electricity of the liquid crystal panel 102 to the side plate 1112.

Figure 3:
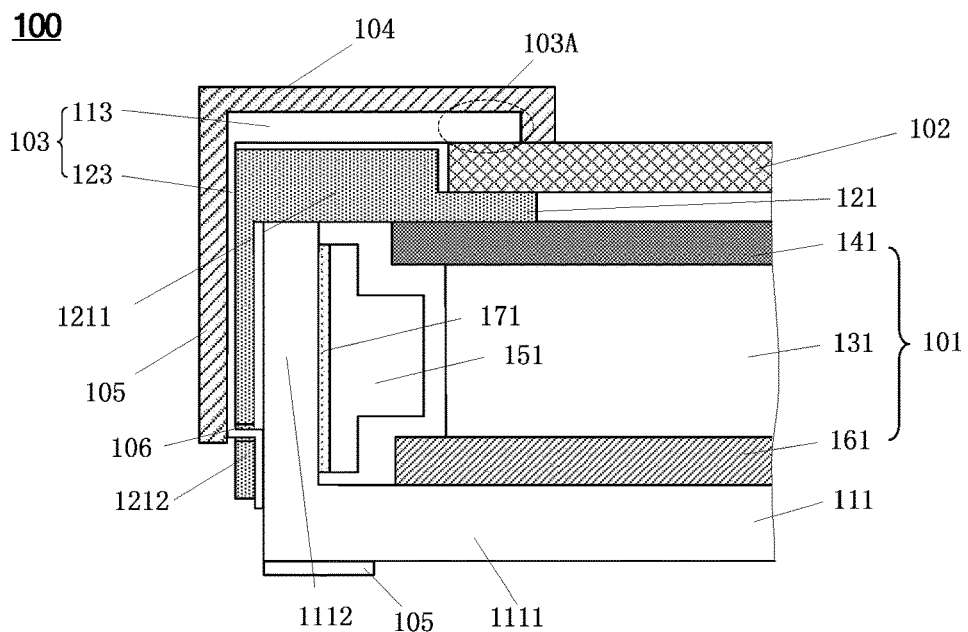
FIG. 3 is a schematic diagram of a display module according to still another embodiment of the present disclosure.

FIG. 3 is a schematic diagram of a display module according to still another embodiment of the present disclosure.

As shown in FIG. 3, the second plastic frame portion 1212 has a through hole 106. The second conductive section 123 passes through the through hole 106 and is connected with at least one of the side plate 1112 and the circuit board 105. In this case, part of the second conductive section 123 is located between the frame 104 and the second plastic frame portion 1212.

In an embodiment of the present disclosure, the second conductive section 123 may be connected with only the side plate 1112 after passing through the through hole 106. In this case, the second conductive section 123 may extend, for example, along the surface of the side plate 1112 after passing through the through hole 106, extend downward, thereby increasing the contact area between the second conductive section 123 and the side plate 1112.

In the above embodiment, the second conductive section 123 passes through the through hole 106 and is connected with at least one of the side plate 1112 and the circuit board 105. In this manner, the second conductive section 123 is directly contact with at least one of the side plate 1112 and the circuit board 105, and the connection between the second conductive section 123 and the side plate 1112 is tighter, further facilitating the conduction of the static electricity of the liquid crystal panel 102 to the side plate 1112 or the circuit board 105.

Figure 4:
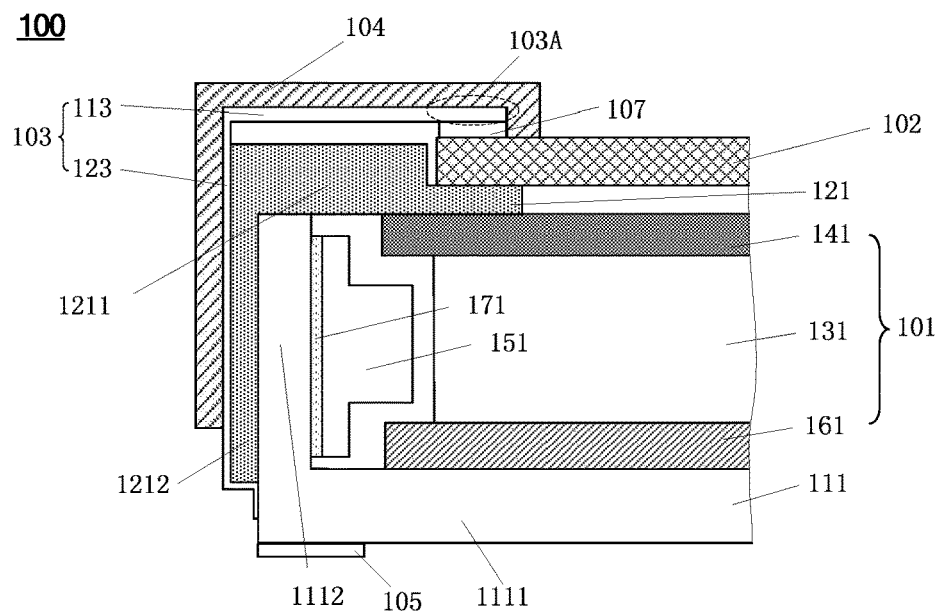
FIG. 4 is a schematic diagram of a display module according to still another embodiment of the present disclosure.

FIG. 4 is a schematic diagram of a display module according to still another embodiment of the present disclosure.

As shown in FIG. 4, the display module may further include a conductive buffer part 107 between the display panel 102 and the elastic portion 103A. The conductive buffer part 107 can absorb the energy generated by the vibration and reduce the adverse effect of the vibration on the display module. For example, the conductive buffer part 107 may include a conductive foam tape, and the like.

It should be noted that, although the conductive buffer part 107 is added in the display module shown in FIG. 4 compared to the display module illustrated in FIG. 1, this is not limitative. For example, the conductive buffer part 107 may be disposed between the display panel 102 and the elastic portion 103A in the display module of any one of the embodiments provided by the present disclosure.

Figure 5:
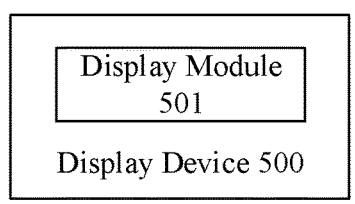
FIG. 5 is a schematic diagram of a display device according to an embodiment of the present disclosure.

FIG. 5 is a schematic diagram of a display device according to some embodiments of the present disclosure. As shown in FIG. 5, the display device 500 may include the display module 501 of any one of the above embodiments. The display device 500 may be any product or component having a display function including, for example, a mobile terminal, a television, a display, a notebook computer, a digital photo frame, a navigator, an electronic paper, and the like.

What are described above is related to the illustrative embodiments of the disclosure only and not limitative to the scope of the disclosure; the scopes of the disclosure are defined by the accompanying claims.

The present application claims the priority to the Chinese Patent Application No. 201820596506.7, filed on Apr. 25, 2018, the entire disclosure of which is incorporated herein by reference as part of the present application.

What is claimed is:

1. A display module, comprising:
    a backplate, comprising a bottom plate and a side plate connected with the bottom plate;
    a backlight module, disposed on the backplate;
    a liquid crystal panel, disposed on the backlight module;
    a frame, configured to fix the liquid crystal panel;
    a circuit board, disposed on the backplate;
    a conductive part, wherein the conductive part is connected with at least one of the backplate or the circuit board, the conductive part comprises an elastic portion connected with the liquid crystal panel, and at least part of the elastic portion is located between the liquid crystal panel and the frame and is configured to be compressed by the frame; and
    a plastic frame, comprising a first plastic frame portion and a second plastic frame portion, wherein the first plastic frame portion is configured to support the liquid crystal panel, and the second plastic frame portion is disposed between the frame and the side plate,
    wherein the conductive part comprises a first conductive section and a second conductive section, the first conductive section is located between the frame and the first plastic frame portion, the elastic portion is disposed on the first conductive section, and the second conductive section is connected with the first conductive section, the second conductive section is connected with at least one of the side plate and the circuit board, and the second conductive section is located at least partially between the frame and the second plastic frame portion.

2. The display module according to claim 1, wherein the elastic portion comprises a foam and a conductive layer covering the foam.

3. The display module according to claim 2, wherein the foam comprises a conductive foam.

4. The display module according to claim 2, wherein the conductive layer comprises a metal sheet or a metal wire braid layer.

5. The display module according to claim 2, wherein the conductive layer is in non-adhesive contact with the liquid crystal panel.

6. The display module according to claim 1, wherein the second conductive section is connected with at least one of the side plate and the circuit board across a lower edge of the second plastic frame portion.

7. The display module according to claim 1, wherein the second conductive section is connected with the side plate through a connector, and the connector passes through the second conductive section and the second plastic frame to be connected with the side plate.

8. The display module according to claim 1, wherein the second plastic frame portion has a through hole, and the second conductive section passes through the through hole to be connected with at least one of the side plate and the circuit board.

9. The display module according to claim 1, wherein the first conductive section is disposed on a surface of the frame facing the bottom plate, and the second conductive section is disposed on a surface of the frame facing the second plastic frame portion.

10. The display module according to claim 1, further comprising a conductive buffer part, the conductive buffer part being located between the liquid crystal panel and the elastic portion.

11. The display module according to claim 10, wherein the conductive buffer part comprises a conductive foam tape.

12. A display device, comprising a display module, the display module comprising:
    a backplate, comprising a bottom plate and a side plate connected with the bottom plate;
    a backlight module, disposed on the backplate;
    a liquid crystal panel, disposed on the backlight module;
    a frame, configured to fix the liquid crystal panel;
    a circuit board, disposed on the backplate;
    a conductive part, wherein the conductive part is connected with at least one of the backplate or the circuit board, the conductive part comprises an elastic portion connected with the liquid crystal panel, and at least part of the elastic portion is located between the liquid crystal panel and the frame and is configured to be compressed by the frame; and
    a plastic frame, comprising a first plastic frame portion and a second plastic frame portion, wherein the first plastic frame portion is configured to support the liquid crystal panel, and the second plastic frame portion is disposed between the frame and the side plate,
    wherein the conductive part comprises a first conductive section and a second conductive section, the first conductive section is located between the frame and the first plastic frame portion, the elastic portion is disposed on the first conductive section, and the second conductive section is connected with the first conductive section, the second conductive section is connected with at least one of the side olate and the circuit board, and the second conductive section is located at least partially between the frame and the second plastic frame portion.

13. The display module according to claim 3, wherein the conductive layer comprises a metal sheet or a metal wire braid layer.

14. The display module according to claim 12, wherein the second conductive section is connected with at least one of the side plate and the circuit board across a lower edge of the second plastic frame portion.

15. The display module according to claim 12, wherein the second conductive section is connected with the side plate through a connector, and the connector passes through the second conductive section and the second plastic frame to be connected with the side plate.

16. The display module according to claim 12, wherein the second plastic frame portion has a through hole, and the second conductive section passes through the through hole to be connected with at least one of the side plate and the circuit board.

17. The display module according to claim 12, wherein the first conductive section is disposed on a surface of the frame facing the bottom plate, and the second conductive section is disposed on a surface of the frame facing the second plastic frame portion.

18. The display module according to claim 2, further comprising a conductive buffer part, the conductive buffer part being located between the liquid crystal panel and the elastic portion.

19. A display module, comprising:
   a backplate, comprising a bottom plate and a side plate connected with the bottom plate;
   a backlight module, disposed on the backplate;
   a liquid crystal panel, disposed on the backlight module;
   a frame, configured to fix the liquid crystal panel;
   a circuit board, disposed on the backplate;
   a conductive part, wherein the conductive part is connected with at least one of the backplate or the circuit board, the conductive part comprises an elastic portion connected with the liquid crystal panel, and at least part of the elastic portion is located between the liquid crystal panel and the frame and is configured to be compressed by the frame; and
   a plastic frame, comprising a first plastic frame portion and a second plastic frame portion, wherein the first plastic frame portion is configured to support the liquid crystal panel, and the second plastic frame portion is disposed between the frame and the side plate.

20. The display module according to claim 19, wherein the elastic portion comprises a foam and a conductive layer covering the foam.

* * * * *